(12) United States Patent
Shimamura et al.

(10) Patent No.: US 8,778,225 B2
(45) Date of Patent: Jul. 15, 2014

(54) IODIDE SINGLE CRYSTAL, PRODUCTION PROCESS THEREOF, AND SCINTILLATOR COMPRISING IODIDE SINGLE CRYSTAL

(75) Inventors: Kiyoshi Shimamura, Tsukuba (JP); Encarnacion Antonia Garcia Villora, Tsukuba (JP); Kenji Kitamura, Tsukuba (JP)

(73) Assignee: Sakai Chemical Industry Co., Ltd., Sakai-shi, Osaka (JP)

( * ) Notice: Subject to any disclaimer, the term of this patent is extended or adjusted under 35 U.S.C. 154(b) by 865 days.

(21) Appl. No.: 12/461,180

(22) Filed: Aug. 4, 2009

(65) Prior Publication Data

US 2010/0065779 A1   Mar. 18, 2010

Related U.S. Application Data

(63) Continuation of application No. PCT/JP2008/052221, filed on Feb. 5, 2008.

(30) Foreign Application Priority Data

Feb. 7, 2007 (JP) ................................. 2007-028141
Feb. 15, 2007 (JP) ................................. 2007-035285

(51) Int. Cl.
*C09K 11/08* (2006.01)
*C09K 11/61* (2006.01)

(52) U.S. Cl.
USPC ................................................. 252/301.4 H

(58) Field of Classification Search
USPC ........ 252/301.17, 301.4 R, 301.4 F, 301.4 H; 250/370.11
See application file for complete search history.

(56) References Cited

U.S. PATENT DOCUMENTS

| | | | |
|---|---|---|---|
| 7,365,333 B1* | 4/2008 | Shah et al. | 250/361 R |
| 7,525,094 B2* | 4/2009 | Cooke et al. | 250/361 R |
| 2006/0049370 A1* | 3/2006 | Shoji et al. | 250/581 |
| 2006/0124854 A1* | 6/2006 | Shah | 250/363.04 |
| 2006/0163484 A1* | 7/2006 | Ichinose et al. | 250/361 R |
| 2007/0090328 A1* | 4/2007 | Dorenbos et al. | 252/301.4 H |
| 2007/0267576 A1* | 11/2007 | Loureiro et al. | 250/362 |
| 2008/0047483 A1* | 2/2008 | Venkataramani et al. | 117/8 |

FOREIGN PATENT DOCUMENTS

WO    WO 2004109333 A1 * 12/2004

* cited by examiner

*Primary Examiner* — Emily Le
*Assistant Examiner* — Lynne Edmondson
(74) *Attorney, Agent, or Firm* — Manabu Kanesaka

(57) ABSTRACT

An object of the invention is to provide an iodide single crystal material that provides a scintillator material for the next-generation TOF-PET, and a production process for high-quality iodide single crystal materials.

The iodide single crystal material of the invention having the same crystal structure as $LuI_3$ and activated by a luminescence center RE where RE is at least one element selected from the group consisting of Ce, Pr, Nd, Sm, Eu, Tb, Dy, Ho, Er, Tm, and Yb is characterized in that a part or the whole of lutetium (Lu) in said iodide single crystal material is substituted by Y and/or Gd.

The inventive production process for an iodide single crystal material is characterized by comprising a step of preparing starting materials comprising an RE metal or $REI_3$, $I_2$, and a metal of at least one element selected from the group consisting of Lu, Y and Gd and/or its iodide provided that when only Lu is selected, there is a Lu metal chosen; a step of maintaining said starting materials under vacuum; a step of heating said starting materials at a reaction temperature to create a raw polycrystal material containing at least $XI_3$:RE where X is said at least one selected element; and a step of turning said raw polycrystal material into a single crystal.

6 Claims, 4 Drawing Sheets

IODIDE SINGLE CRYSTAL, PRODUCTION PROCESS THEREOF, AND SCINTILLATOR COMPRISING IODIDE SINGLE CRYSTAL

ART FIELD

The present invention relates to an iodide single crystal material activated by a luminescence center RE, its production process, and a scintillator comprising an iodide single crystal material.

BACKGROUND ART

Recently, $Lu_2SiO_5$:Ce(LSO), $Lu_{2(1-x)}Y_{2x}SiO_5$:Ce (LYSO), $LuAlO_3$:Ce(LuAP), $Lu_xY_{1-x}AlO_3$:Ce(LuYAP), $LaCl_3$:Ce, $LaBr_3$:Ce and $LuI_3$:Ce have been known for scintillator materials for TOF-PET: time of flight positron emission computed tomography, as set out in Table 1. For instance, see Patent Publications 1, 2 and 3 as well as Non-Patent Publication 1.
Patent Publication 1: JP(A) 2007-16197
Patent Publication 2: JP(B) 2004-532997
Patent Publication 3: USP 2006/0124854A1
Non-Patent Publication 1: M. D. Birowosuto et al., J. Of App. Phys. Vol. 99, 123520 (2006)

The properties of the respective scintillator materials are set out in Table 1.

TABLE 1

| Single Crystal | Density (g/cm³) | Light Quantity (Photons/MeV) | Decay Time (ns) | Max. Emission Wavelength (nm) |
|---|---|---|---|---|
| $Lu_2SiO_5$: Ce (LSO) | 7.4 | 26000 | 40 | 420 |
| $Lu_{2(1-x)}Y_{2x}SiO_5$: Ce (LYSO) @x = 0.1 | 7.1 | 30000 | 40 | 420 |
| $LuAlO_3$: Ce (LuAP) | 8.3 | 11000 | 18160 | 385 |
| $Lu_xY_{1-x}AlO_3$: Ce (LuYAP) @x = 0.2 | 7.3 | 13000 | 20200 | 380 |
| $LaCl_3$: Ce | 3.86 | 46000 | 25 (50%) | 350 |
| $LaBr_3$: Ce | 5.07 | 70000 | 16 (97%) | 380 |
| $LuI_3$: Ce | 5.6 | 90000 | 6-40 (72%) | 472 |

As shown in Table 1, the properties of the scintillator materials demanded for current PETs are primarily:
1. high light output (high light emission),
2. emission wavelength lying in the visible range,
3. high density (heavy crystal),
4. high serviceability, and
5. short decay time (short vanishing time).

Now, among the aforesaid scintillator materials, attention is directed to $LaBr_3$:Ce and $LuI_3$:Ce capable of emitting more light. However, $LaBr_3$:Ce has the disadvantages of being not heavy, costing much, and being deliquescent with the emission wavelength lying in the ultraviolet range. On the other hand, a problem with $LuI_3$:Ce is that it still costs much, although it emits more light than $LaBr_3$:Ce does, with the emission wavelength lying in the visible range. Thus, the development of material that replaces $LuI_3$:Ce as the scintillator material for the next-generation TOF-PET is in great demand.

The LuI scintillators set forth in Patent Publication 3 and Non-Patent Publication 1 are grown by the Bridgman method using $LuI_3$ and $CeI_3$ as the raw materials. The raw materials $LuI_3$ and $CeI_3$, especially $LuI_3$ give rise to rises in the cost of the ensuing LuI scintillator, because raw materials synthesis costs much. $LuI_3$ and $CeI_3$, especially $LuI_3$ may possibly degrade the ensuing LuI scintillator because of entraining impurities such as water, chlorine, bromine, etc. during the raw materials synthesis.

In other words, it would be more advantageous to produce LuI scintillators without using $LuI_3$ as the raw material.

OBJECT OF THE INVENTION

Thus, the present invention has for its primary object to provide an iodide single crystal material that may be used as the scintillator material for the coming-generation TOF-PET, and a production process for high-quality iodide single crystal materials.

DISCLOSURE OF THE INVENTION

To achieve the aforesaid object, the present invention is embodied as follows.
Invention 1:
An iodide single crystal material having the same crystal structure as $LuI_3$ and activated by a luminescence center RE where RE is at least one element selected from the group consisting of Ce, Pr, Nd, Sm, Eu, Tb, Dy, Ho, Er, Tm, and Yb, characterized in that a part of lutetium (Lu) in said iodide single crystal material is substituted by Y and/or Gd.
Invention 2:
An iodide single crystal material as recited in Invention 1, characterized in that a part or the whole of the remaining lutetium (Lu) is further substituted by an M element where M is at least one element selected from the group consisting of La, Sc, Hf, Zr, Ti, Ge, Ga, Al, Si, In, Nb, Ta, Ca, Mg, and Ba.
Invention 3:
An iodide single crystal material as recited in Invention 1, characterized in that said RE is Ce and/or Pr.
Invention 4:
A production process for an iodide single crystal material having the same crystal structure as $LuI_3$ and activated by a luminescence center RE where RE is at least one element selected from the group consisting of Ce, Pr, Nd, Sm, Eu, Tb, Dy, Ho, Er, Tm, and Yb, characterized by comprising a step of preparing starting materials comprising an RE metal or $REI_3$, $I_2$, and a metal of at least one element selected from the group consisting of Lu, Y and Gd and/or its iodide provided that when only Lu is selected, there is a Lu metal chosen; a step of maintaining said starting materials under vacuum; a step of heating said starting materials at a reaction temperature to create a raw polycrystal material containing at least $XI_3$:RE where X is said at least one selected element; and a step of turning said raw polycrystal material into a single crystal.
Invention 5:
A production process for an iodide single crystal material as recited in Invention 4, characterized in that said iodide single crystal material is a single crystal material of the formula $Lu_{1-x}RE_xI_3$ ($1\times10^{-4}<x<0.2$), said starting materials comprise an RE metal or $REI_3$, $I_2$ and a Lu metal, and said $XI_3$:RE is $LuI_3$:RE.
Invention 6:
A production process for an iodide single crystal material as recited in Invention 5, characterized in that the RE in said RE metal or $ReI_3$ is Ce or Pr.
Invention 7:
A production process for an iodide single crystal material as recited in Invention 4, characterized in that in said preparation step, said starting materials further include a metal of an M element where M is at least one element selected from the group consisting of Zr, Ti, Ge, Ga, Al, Si, In, Nb, Ta, Ca, Mg, and Ba and/or its iodide, and in said step of creating said raw polycrystal material, said raw polycrystal material further includes an iodide of said M element activated by said RE.

Invention 8:

A scintillator constructed of an iodide single crystal material, characterized by comprising an iodide single crystal material as recited in any one of Inventions 1, 2 and 3.

ADVANTAGES OF THE INVENTION

The iodide single crystal material according to the invention has the same crystal structure as $LuI_3$, and is activated by the luminescence center RE where RE is at least one element selected from the group consisting of Ce, Pr, Nd, Sm, Eu, Tb, Dy, Ho, Er, Tm, and Yb. The iodine single crystal material here is further characterized in that a part of lutetium therein is substituted by Y and/or Gd. Y that replaces lutetium contributes to an increased light emission. On the other hand, Gd that replaces lutetium contributes to improvements in energy resolution. If such single crystal materials are used for PET, further performance improvements would be expected.

The inventive production process for an iodide single crystal material having the same crystal structure as $LuI_3$, and activated by the luminescence center RE where RE is at least one element selected from the group consisting of Ce, Pr, Nd, Sm, Eu, Tb, Dy, Ho, Er, Tm, and Yb involves the step of preparing starting materials comprising an RE metal or $REI_3$, $I_2$, a metal of at least one element selected from the group consisting of Lu, Y and Gd and/or its iodide provided that when only Lu is selected, there is a Lu metal chosen. Especially with the use of the metal of at least one element selected from the group consisting of Lu, Y and Gd, it is possible to provide single crystal materials at low costs, because inexpensive raw materials are available. Further, with only Lu chosen for the production of lutetium iodide activated by RE, the Lu metal can be used in place of $LuI_3$ so that the starting materials can have a decreased concentration of impurities, which could make the concentration of impurities in the ensuing single crystal material very low.

The inventive production process comprises the step of maintaining the starting materials under vacuum, the step of heating the starting materials at a reaction temperature to create a raw polycrystal material containing at least $XI_3$:RE where X is said at least one selected element, and the step of turning the raw polycrystal material into a single crystal. Maintaining the starting materials under vacuum allows removal of additional impurities such as water so that high-quality single crystals can be provided.

Figure 1:
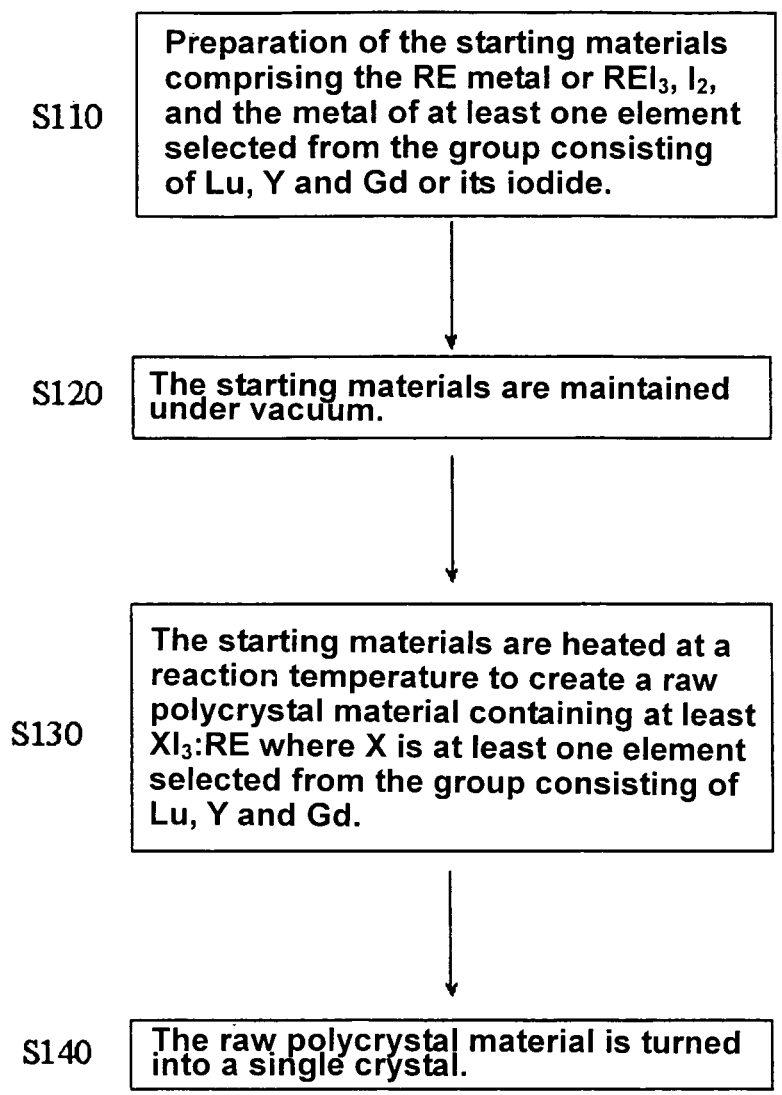
FIG. 1 is illustrative of a step flow for the production of the inventive iodide single crystal material.

EXPLANATION OF THE REFERENCES 200, 300, 400: Single crystal-growth apparatus
210: Reaction tube
220: Boat
230: High-temperature zone heater device
240: Low-temperature zone heater device
250, 360, 480: Melts
260, 370, 490: Crystals
270: Growth interface
310, 410: Chambers
320: Crucible
330: Heater
340: Pulling shaft
350, 470: Seed crystals
420: First shaft
430: Second shaft
440: Lamp
450: Reaction tube
460: Raw polycrystal material

BEST MODE FOR CARRYING OUT INVENTION

The single crystal material of the invention is an iodide single crystal material activated by the luminescence center RE. By the "iodide single crystal material" referred to here, it is intended to include a single crystal material having the same crystal structure as lutetium iodide with the whole of the Lu site substituted by other element or elements, although the ensuing single crystal material is not always lutetium iodide of the chemical formula: $LuI_3$. In what follows, the "single crystal material" will be called the "single crystal" for the sake of simplicity.

The iodide single crystal here is activated by the luminescence center RE where RE is at least one element selected from the group consisting of Ce, Pr, Nd, Sm, Eu, Tb, Dy, Ho, Er, Tm, and Yb. With these luminescence centers replacing the lutetium site, the iodide single crystal shows scintillation capability. Among the luminescence centers, Ce, and Pr is preferable.

For instance, Ce has only one electron on the 4f orbit, so the energy level in the $(4f)^{n-1}(5d)^1$ excited state is lowest among the aforesaid rare-earth elements. For this reason, the light emission of the aforesaid rare-earth elements is forbidden transition $((4f)^n-(4f)^n)$ that is a fluorescence life of ms order, whereas the light emission of Ce is allowed transition $(f^n-f^{n-1}d)$ that is a fluorescence life of a few tens ns order, whereby the decay time constant may be taken down at least one digit (for instance, the millisecond order can be taken down three digits to the nanosecond order). Likewise, Pr brings about allowable transition of similar $(4f)^{n-1}(5d)^1$ too, making it possible to take down the decay time constant one digit (for instance, the millisecond order could be taken down three digits to the nanosecond order). By use of Ce and/or Pr or combinations of Ce and/or Pr with the aforesaid rare-earth elements, decreases in the imaging time by TOF-PET, improvements in resolution, etc. would be expected.

As a matter of course, the luminescence centers RE's may be used in combination of two or more. Note here that the activation amount of the luminescence center RE should be in the range of 0.01 at % to 20 at %. At less than 0.01 at %, RE does not function as the luminescence center, and at greater than 20 at %, there are occasions when concentration quenching may occur.

In the inventive iodide single crystal, a part of the Lu site is substituted by Y and/or Gd. When a part of the Lu site is substituted by Y, Y has a function of increasing light emission, resulting in PET having a high spatial resolution and energy resolution, and improved precision due to decreased scattering fractions. While it is understood that the amount of substitution by Y should preferably be in the range of 5 at % to 20 at %. At less than 5 at %, there are occasions when the desired increased light emission by Y is not obtained, and at greater than 20 at %, there is a risk that the homogeneity and density of the crystal may go low.

When a part of the Lu site is substituted by Gd, Gd has a function of improving energy resolution. In addition, although the increase in light emission is less than could be achieved by Y substitution, much higher sensitivity would be expected because Gd is larger than Y in terms of the effective atomic number. When Ce is used as the luminescence center RE and Lu is substituted by Gd, it is then possible to improve the density and homogeneity of the whole of the crystal because in terms of ionic radius, Gd is closer to Ce rather than Lu. Consequently, incident events occur less often, ending up with improved PET precision.

As is the case with Y, the amount of substitution by Gd should preferably be in the range of 5 at % to 20 at %. At less than 5 at %, there are occasions when the desired increased energy resolution by Gd is not obtained, and at greater than 20 at %, there is a risk that the homogeneity and density of the crystal may go low.

As a matter of course, Y and Gd may be used in combination. In that case, increased light emission and increased energy resolution may optionally set in terms of ratio to determine the amount of substitution by Y and Gd.

Further in the inventive iodide single crystal, a part or the whole of the Lu site may be substituted by Y and/or Gd plus the M element where M is at least one element selected from the group consisting of La, Sc, Hf, Zr, Ti, Ge, Ga, Al, Si, In, Nb, Ta, Ca, Mg, and Ba. All these M elements contribute to increased light emission. While the amount of these M elements to be added may be about 100 ppm in consideration of the crystallizability, effect, etc. of the single crystal, it is understood that greater amount may be added depending on the chosen element (for instance, Zr).

Among these M elements, Zr and/or Hf are preferred. This is because for instance when the luminescence center RE is Ce, the Zr and Hf elements work to make sure the stable maintenance of the state of Ce ions in the crystal in the form of $Ce^{3+}$ rather than $Ce^{4+}$ that decreases light emission. More specifically, the Zr and Hf elements are all found in tetravalent form at the Lu site ($Lu^{3+}$) in the iodide single crystal, allowing charge compensation to work. By this charge compensation, $Ce^{4+}$ is turned into $Ce^{3+}$ to prevent light emission from decreasing.

The inventive production process for the iodide single crystal is now explained.

FIG. 1 is a step flow according to which the inventive iodide single crystal is produced.

Step S110

There are the starting materials prepared which include the RE metal or $REI_3$, $I_2$, and the metal of at least one element selected from the group consisting of Lu, Y and Gd or its iodide.

Note here that when only Lu is selected from Lu, Y and Gd, the Lu metal is chose. In the invention, when the $LuI_3$ single crystal activated by RE is produced, high-purity materials may be used because the Lu metal is used in place of $LuI_3$. Consequently, impurity concentrations and costs can be lower than could be achieved by the prior art.

The thus prepared starting materials are placed in a reaction tube. The reaction tube may be built up of platinum, iridium or quartz, but platinum and iridium are expensive, although they are high-melting metals relatively less reactive to the starting materials. Over these, the quartz reaction tube is preferable because it is a generally available, inexpensive tube that has a melting and softening point higher than those of the aforesaid two metals as well as an extremely reduced reactivity to the starting materials.

The RE metal is at least one metal selected from the group consisting of Ce, Pr, Nd, Sm, Eu, Tb, Dy, Ho, Er, Tm, and Yb, and $REI_3$ is at least one iodide selected from the group consisting of $CeI_3$, $PrI_3$, $NdI_3$, $SmI_3$, $EuI_3$, $TbI_3$, $DyI_3$, $HoI_3$, $ErI_3$, $TmI_3$, and $YbI_3$. Rare-earth elements that form them are all known to function as a luminescence center. Among others, preference is given to the RE metal consisting of at least Ce or Pr, or $REI_3$ consisting of at least $CeI_3$ or $PrI_3$.

The metal of at least one element selected from the group consisting of Lu, Y and Gd and/or its iodide, and the RE metal or $REI_3$ may be in a lump, powder or chip form, although preference is given to the chip form. The lump has a risk of making the reactivity of the starting materials low, although it is effective for prevention of oxidization of the starting materials due to its smallest specific surface area. On the other hand, the powder makes the reactivity of the starting materials high, but there is a possibility that the oxidization of the starting materials may be accelerated due to the largest specific surface area. Thus, the chip is desired for the reasons of appropriate reactivity and appropriate prevention of oxidization of the starting materials. $I_2$ is ordinarily in an amorphous particulate form having an average particle diameter in the range of 1 to 10 mm. Particles having an average particle diameter of less than 1 mm tend to cling and stick to the surface of moisture particles that are impurities due to larger specific surface areas, and particles having an average particle diameter of greater than 10 mm tend to retard reactions due to smaller specific surface areas. Note that the "average particle diameter" here refers to the value of a weight-average particle diameter measured by the dynamic light scattering method; however, it is understood that how to find the average particle diameter is not limited to the foregoing, and there are a bit differences in measurements depending on the measuring methods used. In addition, $I_2$ particles are not always of perfect circle shape, and may include spheres whose aspect ratio is not 1.

The metal of at least one element selected from the group consisting of Lu, Y and Gd and/or its iodide, the RE metal or $REI_3$ and $I_2$ are weighed and mixed together in such a way as to meet the molar fraction: (Lu, Y and/or Gd+RE):$I_2$=1:1.2 to 4.5. Note here that the respective amounts of Lu, Y and Gd are optionally adjusted with the composition of the desired single crystal in mind.

When the Lu metal, the RE metal or $REI_3$ and $I_2$ are used, they should preferably be mixed together in such a way as to provide the composition: $Lu_{1-x}RE_xI_3$ where $1\times10^{-4}<x<0.2$.

Why $I_2$ is weighed in such a way as to be richer than the stoichiometric composition of lutetium iodide is that most of $I_2$ evaporates because the vapor pressure of $I_2$ is much higher than that of Lu, Y, Gd, and RE. Note here that when the amount of RE to be doped is less than 0.01%, there is a fear that the RE may not function as the luminescence center, whereas when the amount of RE to be doped is greater than 20%, fluorescence decreases due to concentration quenching.

The invention is characterized in that when the $LuI_3$ single crystal activated by RE is produced, the Lu metal is used in place of $LuI_3$, as describe above. However, when there is an iodide single crystal produced in which a part or the whole of the Lu site in the $LuI_3$ single crystal activated by RE is substituted by Y and/or Gd, too, the metal of at least one element selected from the group consisting of Lu, Y and/or Gd may intentionally be used in place of the iodide of at least one element selected from the group consisting of Lu, Y and Gd. It is then possible to obtain single crystals of ever higher purity, because if the metals of such selected elements, the RE metal (or $REI_3$) and $I_2$ are separately used, then materials of much higher purity can be used. In addition, costs can be slashed because costly iodides are used as little as possible.

Note here that when at least one element selected from the group consisting of Lu, Y and Gd is also used, these elements may all be used in an iodide form.

In addition to the metal of at least one element selected from the group consisting of Lu, Y and Gd and/or its iodide, the starting materials may further contain the metal of the M element and/or its iodide where M is at least one element selected from the group consisting of La, Sc, Hf, Zr, Ti, Ge, Ga, Al, Si, In, Nb, Ta, Ca, Mg, and Ba. These elements have a function of increasing light emission. Among these M elements, preference is given to the metal of Hf and/or Zr or its iodide because they have the aforesaid charge compensation effect.

Step S120

The starting materials are maintained under vacuum. That is, the reaction tube is evacuated to a vacuum, thereby preventing oxidization of the starting materials. The degree of vacuum should be at least $1\times10^{-3}$ Pa. Under a vacuum lower than that, moisture in the starting materials cannot efficiently be removed. If the degree of vacuum of $1\times10^{-3}$ Pa is kept, the moisture in the starting materials can be reduced down to 1 ppm or lower. More preferably, the degree of vacuum should be $1\times10^{-5}$ Pa or lower. If the degree of vacuum is maintained in this range, the moisture in the starting materials can then be much more reduced. Note here that for the purpose of keeping such a high degree of vacuum, for instance, it is effective to use vacuum equipment built up of a rotary pump and turbo pump combination.

Note here that the starting materials may be evacuated to a vacuum while they are heated in the temperature range of $0.5\times10^{2\circ}$ C. to $6\times10^{2\circ}$ C. Removal of moisture and other impurities present in the starting materials is accelerated by heating so that single crystals of ever higher purity can be obtained. Preference is given to the temperature range of $0.5\times10^{2\circ}$ C. to $1.6\times10^{2\circ}$ C. at which removal of impurities can occur while preventing vaporization of $I_2$ (the melting point: about 110° C., and the boiling point: about 180° C.) in the starting materials. Depending on the amount of $I_2$ contained in the starting material and when $REI_3$ is used for the starting material, however, a high $6\times10^{2\circ}$ C. may be applied.

Subsequent to Step S120, the reaction tube may be filled inside with a gas selected from the group consisting of hydrogen gas, an inert atmosphere gas, and their mixed gas. This prevents oxidization of the starting materials, and holds back evaporation and sublimation. For the inert atmosphere gas, for instance, use may be made of $N_2$, He, Ne, and Ar.

Step S130

The starting materials are heated at the reaction temperature to create a raw polycrystal material including at least $XI_3$:RE where X is at least one element selected from the group consisting of Lu, Y and Gd. Set out in Table 2 are exemplary conditions for the heating and reaction of the starting materials when the raw polycrystal material including at least $LuI_3$:RE is created.

TABLE 2

| | |
|---|---|
| Mixing Ratio (Lu + Re: $I_2$) | 1:1.2 to 4.5 by mole |
| Heating Temp. (° C.) | 700° C. to 1,200° C. |
| Heating Time (Hr) | 1 to 24 hours |
| Heating Atmosphere | Vacuum ($1 \times 10^{-3}$ Pa to $1 \times 10^{-6}$ Pa), Hydrogen Gas, Inert Atmosphere Gas or Hydrogen Gas + Inert Atmosphere Gas |

The heating temperature is in the range of $7\times10^{2\circ}$ C. to $12\times10^{2\circ}$ C. Given $7\times10^{2\circ}$ C. or higher, the reaction could be accelerated because it is greater than the melting point of each of the starting materials. At higher than $12\times10^{2\circ}$ C., there is a fear that the starting materials may vaporize, failing to obtain the desired raw polycrystal material. The heating time should be in the range of 1 hour to 24 hours. In less than 1 hour, there are occasions when there is no sufficient proceeding of the reaction, and longer than 24 hours reaction takes no effect because no further reaction occurs. For heating, use may be made of a furnace that relies upon any desired heating mode such as metal resistance heating mode, electric resistance heating mode, graphite resistance heating mode, high-frequency induction heating mode, and thermal imaging mode.

After the heating and reaction of the starting materials, the reaction tube is cooled down to room temperature. The thus obtained reaction product is a raw polycrystal material containing at least $XI_3$:RE. In addition to $XI_3$:RE, the raw polycrystal material may contain $REI_3$ and $XI_3$. Cooling down to room temperature may be achieved by cooling off the reaction tube.

Regarding Step S110, note that when the starting materials contain the metal of the M element and/or its iodide, the raw polycrystal material could contain the iodide of the M element activated by RE.

Step S140

The raw polycrystal material obtained in Step S130 is turned into a single crystal. To this end use may be made of any desired method selected from the group consisting of a boat method, a pulling method and a zone melt method. Particular preference is given to the boat method, and the zone melt method, because they make sure crystal growth in the state where perfect atmosphere control is achieved while the raw polycrystal material is filled up in the reaction tube. The boat method, and the zone melt method is advantageous for slashing costs, because they make use of simplified equipment and so do not need any costly system. In addition, increases in the size of the ensuing crystal would be expected. The use of the raw polycrystal material obtained using less costly starting materials having low concentrations of impurities also makes the finally obtained iodide single crystal inexpensive, low in impurities concentrations, and high in quality.

More specifically, the "boat method" here includes the Bridgman method represented by the horizontal Bridgman method and the vertical Bridgman method, and the gradient freeze method represented by the horizontal gradient freeze method and the vertical gradient freeze method. The "zone melt method", for instance, includes the zone melt method represented by the horizontal zone melt method and the vertical zone melt method as well as the floating zone method. The "pulling method", for instance, includes the Czochralski method and the edge-defined film-fed growth (EFG) method.

Through the aforesaid Steps S110 to S140, the inventive iodide single crystal is obtained.

Regarding Step S140, note that with the boat method or the zone melt method, the reaction tube may be opened and evacuated to a vacuum prior to Step S140. This makes the quality of the ensuing single crystal much higher, because impurities such as useless gas and water occurring within the reaction tube at Step S130 are removed off. Also, when the reaction tube is evacuated to a vacuum, additional $I_2$ may be added to it, thereby making up for $I_2$ vaporized in Step S130. After evacuated to a vacuum, the reaction tube may be filled inside with the gas selected from the group consisting of hydrogen gas, and inert atmosphere gas, and their mixed gas, thereby preventing oxidization of the raw polycrystal material and holding back evaporation and sublimation.

The invention is now explained in further details with reference of examples; however, it should be understood that the invention is by no means limited to them.

EXAMPLE 1

The starting materials used here were an oil-immersed Lu metal (in a chip form of 3 N (99.9% by mass) purity: made by Nippon Yttrium Co., Ltd.), an oil-immersed Ce metal as the RE metal (in a chip form of 3 N (99.9% by mass) purity: made by Nippon Yttrium Co., Ltd.), $I_2$ powders (in an amorphous particulate form of 1 to 10 mm$\phi$ and 5 N (99.999% by mass) purity: made by Japan Pure Chemical Co., Ltd.) and an oil-immersed Y metal (in a chip form of 3 N (99.9% by mass) purity: made by Nippon Yttrium Co., Ltd.).

The Lu metal, Y metal and Ce metal were immersed, stirred and washed in a beaker charged with acetone, thereby removing oil deposits. Then, the Lu metal, Y metal and Ce metal after washing as well as $I_2$ were weighed. For the purpose of preventing oxidization of the Lu metal, Y metal and Ce metal, weighing was carried out in an acetone-charged beaker too. As a result of weighing, the Lu metal, Y metal, Ce metal and $I_2$ were found to be 26.8 g, 0.756 g, 1.19 g and 71.3 g, respectively, with the $(Lu+Y+Ce):I_2$ being 1:1.65 by mole. Then, the weighed Lu metal, Y metal, Ce metal and $I_2$: the starting materials were placed in a quartz reaction tube (quartz tube) (Step S110 of FIG. 1).

After that, the quartz tube was evacuated by a rotary pump and a turbo pump to a degree of vacuum of $1\times10^{-4}$ Pa to $1\times10^{-5}$ Pa (Step S120 of FIG. 1), whereby acetone deposits on the surfaces of the Lu metal, Y metal and Ce metal were completely removed off. By that evacuation, water or other impurity deposits on $I_2$, too, were removed while the oxidization of the Lu metal, Y metal and Ce metal was held back.

Then, with the vacuum maintained, the starting materials were heated up to 1,070° C. for reactions (Step S130 of FIG. 1). Heating and reactions were carried out at 1,070° C. for 3 hours, after which the reaction product was cooled down to room temperature.

From powder X-ray diffractometry, the thus obtained sample was found to have only diffraction peaks for $LuI_3$, $YI_3$ and $CeI_3$, with none of the remaining Lu metal, Y metal and Ce metal. The obtained sample was also found to be a raw polycrystal material consisting of $LuI_3$, $YI_3$, $Lu_{1-x}Y_xI_3$ where 0<x<1, $CeI_3$, Ce-doped $LuI_3$, Ce-doped $YI_3$, and Ce-doped $Lu_{1-x}Y_xI_3$ where 0<x<1.

Then, such a raw polycrystal material was turned into a single crystal (Step S140 of FIG. 1), using the horizontal Bridgman method.

Figure 2:
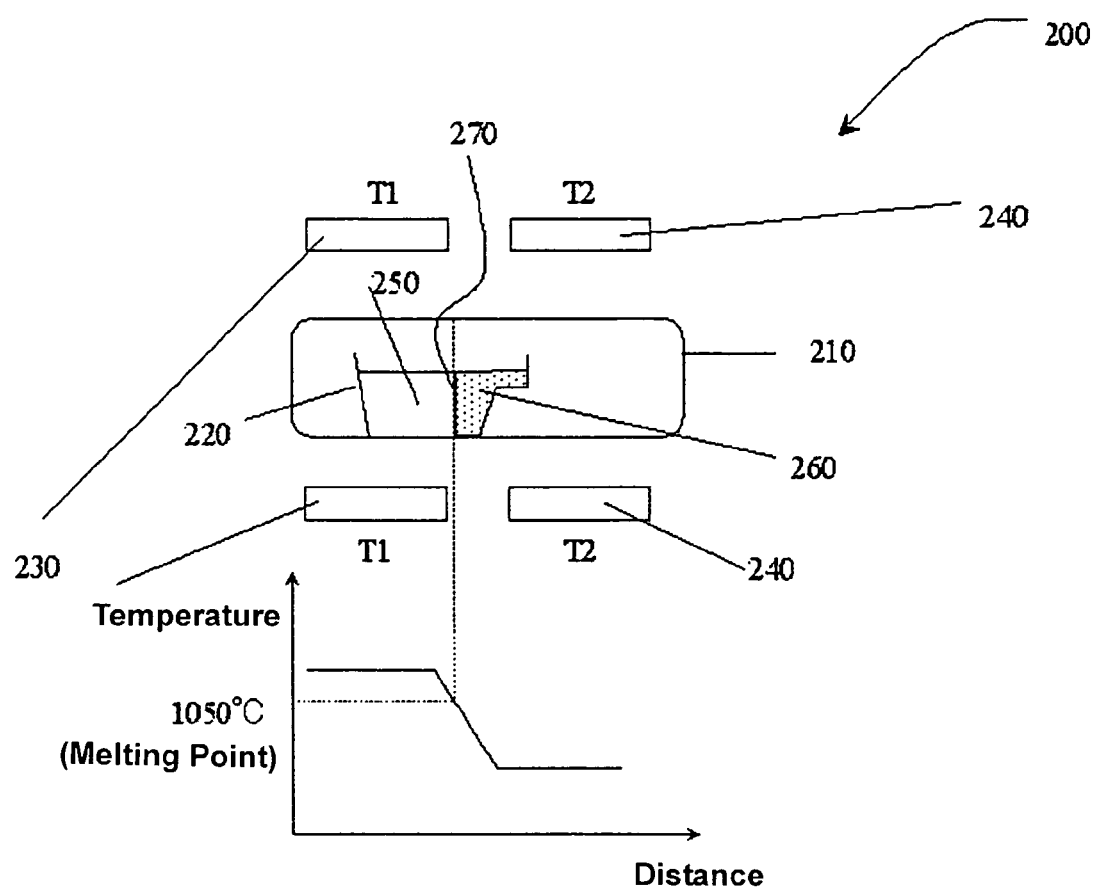
FIG. 2 is illustrative in schematic of how iodide single crystal materials (e.g., $Lu_{1-x}Ce_xI_3$ single crystal materials where $1\times10^{-4}<x<0.2$, etc.) are produced by the inventive process using the horizontal Bridgman method.

FIG. 2 is illustrative in schematic of how the inventive iodide single crystal is produced using the horizontal Bridgman method.

A single crystal-growth apparatus 200 is built up of a reaction tube 210, a boat 200 located within the reaction tube 210, a high-temperature zone heater device 230 and a low-temperature zone heater device 240.

The boat 220 receives the raw polycrystal material. Note here that the boat 200 may be provided at its end with a seed crystal (not shown) of $LuI_3$. The reaction tube 210 is maintained inside at a degree of vacuum of $1\times10^{-5}$ Pa to $1\times10^{-6}$ Pa. Note here that the reaction tube 210 may be filled inside with a gas selected from the group consisting of hydrogen gas, an inert atmosphere gas, and a mixed gas thereof. In this case, Example 1 may be carried out such that after removal of the raw polycrystal material from the reaction tube, the quartz boat 220 with the raw polycrystal material located in it is placed in another quartz reaction tube (quartz tube), which is again evacuated to a vacuum and charged inside with gas. Note here that $I_2$ may be added.

The high-temperature zone heater device 230, and the low-temperature zone heater device 240 may operate in any desired heating mode such as metal resistance heating mode, electric resistance heating mode, graphite resistance heating mode, high-frequency induction heating mode, and thermal imaging mode. The high-temperature zone heater device 230 is kept in a temperature range of 1,050° C. to 1,100° C., and the low-temperature zone heater device 240 is kept in a temperature range of 600° C. to 900° C. Consequently, such a temperature gradient as depicted in the lower part of FIG. 2 is formed.

How to produce the iodide single crystal using the horizontal Bridgman method is now explained with reference to FIG. 2.

The boat 220 with the polycrystal material located in it was moved from the high-temperature zone heater device 230 to the low-temperature zone heater devicer 240 at a speed of 3 mm/hour. The raw polycrystal material located in the boat 220 is turned by the high-temperature zone heater device 230 into a melt 250. As the boat 220 arrives at the low-temperature zone heater device 240, it causes a part of the melt 250 to reach a point of solidification and turn into a crystal 260. As the boat 220 is moved further into the low-temperature zone heater device 240, it permits a growth interface 270 to move sequentially left toward the FIG. 2, causing crystal growth.

It is here noted that such movement of the boat 220 may take place once or twice or more or the boat 220 may be reciprocated, but once in Example 1.

In this way, there is the iodide single crystal 260 obtained in the boat 220. ICP emission analysis was applied to the single crystal produced here to examine its composition. As a result, the obtained single crystal was found to be $Lu_{0.90}Y_{0.05}Ce_{0.05}I_3$. The obtained single crystal was also found to have a length and diameter of 34 cm and 0.8 cm, respectively.

A sample of 4 mm×6 mm×20 mm size was cut out of the obtained single crystal to examine the density of the single crystal, using a densimeter (Accupyc 1330-2 made by Shimadzu Co., Ltd.). The obtained single crystal was found to have a density of 5.5 g/cm$^3$.

Then, the fluorescent spectra of the sample were measured by use of a fluorescence spectrophotometer (F-450 made by Hitachi Ltd.). An excitation wavelength at which fluorescence intensity reaches a maximum was 472 nm.

Then, the sample was measured for light emission. For the radiation source, use was made of Cs-137 that is a standard gamma radiation source. The obtained light emission was 105300 (photons/MeV). This figure is the largest among the materials known so far in the art, confirming that the inventive single crystal has high light emission. In addition, a fluorescence decay time found using the obtained energy spectra was 20 ns, a figure comparable to that of the materials known so far in the art.

Set out in Table 3 are the typical results of the sample obtained in Example 1, samples having varying amounts of substitution by Y, and samples with Gd and/or Zr added to them in addition to or in place of Y.

TABLE 3

| Single Crystal | Density (g/cm$^3$) | Light Quantity (Photons/MeV) | Decay Time (ns) | Max. Emission Wavelength (nm) |
|---|---|---|---|---|
| $(Lu,Y)_{1-\alpha}Ce_\alpha I_3$ | 5.5 | 105300 | 6-40 (72%) | 472; 535 |
| $(Lu,Gd)_{1-\alpha}Ce_\alpha I_3$ | 5.5 | 80000 | 6-40 (72%) | 472; 535 |
| $(Lu,Y,Gd)_{1-\alpha}Ce_\alpha I_3$ | 5.5 | 95000 | 6-40 (72%) | 472; 535 |
| $(Lu,Y,Zr)_{1-\alpha}Ce_\alpha I_3$ | 5.5 | 105800 | 6-40 (72%) | 472; 535 |
| $(Lu,Gd,Zr)_{1-\alpha}Ce_\alpha I_3$ | 5.5 | 85000 | 6-40 (72%) | 472; 535 |
| $(Lu,Y,Gd,Zr)_{1-\alpha}Ce_\alpha I_3$ | 5.5 | 95300 | 6-40 (72%) | 472; 535 |
| $(Y,Zr)_{1-\alpha}Ce_\alpha I_3$ | 5.5 | 110000 | 6-40 (72%) | 472; 535 |

All α here was 0.05, with the figures on the right side of the maximum emission wavelength corresponding to the second peak. Ordinarily, the first peak overlaps the second peak.

In Example 1, the horizontal Bridgman method is typically used as the single crystal growth method; however, the invention is in no sense limited to it. For single crystal growth, use may be made of any desired method such as the Czochralski method, and the floating zone Method.

EXAMPLE 2

The starting materials used here were an oil-immersed Lu metal (in a chip form of 3 N (99.9% by mass) purity: made by Nippon Yttrium Co., Ltd.), an oil-immersed Ce metal as the RE metal (in a chip form of 3 N (99.9% by mass) purity: made by Nippon Yttrium Co., Ltd.), and $I_2$ powders (in an amorphous particulate form of 1 to 10 mmϕ and 5 N (99.999% by mass) purity: made by Japan Pure Chemical Co., Ltd.).

The Lu metal and Ce metal were immersed, stirred and washed in a beaker charged with acetone, thereby removing oil deposits. Then, the Lu metal and Ce metal after washing as well as $I_2$ were weighed. For the purpose of preventing oxidization of the Lu metal and Ce metal, weighing was carried out in an acetone-charged beaker too. As a result of weighing, the Lu metal, Ce metal and $I_2$ were found to be 28.1 g, 1.18 g and 70.7 g, respectively, with the (Lu+Ce):$I_2$ being 1:1.65 by mole. Then, the weighed Lu metal, Ce metal and $I_2$: the starting materials were placed in a quartz reaction tube (quartz tube) (Step S110 of FIG. 1.

After that, the quartz tube was evacuated by a rotary pump and a turbo pump to a degree of vacuum of $1\times10^{-4}$ Pa to $1\times10^{-5}$ Pa (Step S120 of FIG. 1), whereby acetone deposits on the surfaces of the Lu metal and Ce metal were completely removed off. By that evacuation, water or other impurity deposits on $I_2$, too, were removed while the oxidization of the Lu metal and Ce metal was held back.

Then, with the vacuum maintained, the starting materials were heated up to 1,070° C. for reactions (Step S130 of FIG. 1). Heating and reactions were carried out at 1,070° C. for 3 hours, after which the reaction product was cooled down to room temperature.

From powder X-ray diffractometry, the thus obtained sample was found to have only diffraction peaks for $LuI_3$ and $CeI_3$, with none of the remaining Lu metal and Ce metal. The obtained sample was also found to be a raw polycrystal material consisting of $LuI_3$, $Ce_3$, and Ce-doped $LuI_3$.

EXAMPLE 2-1

Using the horizontal Bridgman method, a $Lu_{1-x}Ce_xI_3$ single crystal was produced from the raw polycrystal material obtained in Example 2 (Step S140 of FIG. 1).

FIG. 2 is illustrative in schematic of how the inventive iodide single crystal is produced using the horizontal Bridgman method.

A single crystal-growth apparatus 200 is built up of a reaction tube 210, a boat 200 located within the reaction tube 210, a high-temperature zone heater device 230 and a low-temperature zone heater device 240.

The boat 220 receives the raw polycrystal material produced in Example 2. Note here that the boat 200 may be provided at its end with a seed crystal (not shown) of $LuI_3$. The reaction tube 210 is maintained inside at a degree of vacuum of $1\times10^{-5}$ Pa to $1\times10^{-6}$ Pa. Note here that the reaction tube 210 may be filled inside with a gas selected from the group consisting of hydrogen gas, an inert atmosphere gas, and a mixed gas thereof. In this case, Example 2 may be carried out such that after removal of the raw polycrystal material from the reaction tube, the quartz boat 220 with the raw polycrystal material located in it is placed in another quartz reaction tube (quartz tube), which is again evacuated to a vacuum and charged inside with gas. Note here that $I_2$ may be added.

The high-temperature and low-temperature zone heater devices 230 and 240 are operated in the same mode and under the same temperature conditions as in Example 1.

How to produce the $Lu_{1-x}Ce_xI_3$ single crystal using the horizontal Bridgman method is now explained with reference to FIG. 2.

The boat 220 with the raw polycrystal material placed in it was moved once as in the same way as in Example 1.

Consequently, the $Lu_{1-x}Ce_xI_3$ single crystal 260 is obtained in the boat 220. Note here that ICP emission analysis was applied to the single crystal produced from the raw polycrystal material of Example 2 to examine its composition. As a result, it has been found that the ensuing single crystal is $Lu_{0.95}Ce_{0.05}I_3$ with a length and diameter of 34 cm and 0.8 cm, respectively.

While the horizontal Bridgman method is explained in Example 2-1, it should be understood that the invention may also be applied to the vertical Bridgman method. In Example 2-1, the single crystal could also be obtained by the gradient freeze method wherein the high-temperature and low-temperature zone heater devices 230 and 240 have varying temperature distributions.

EXAMPLE 2-2

Using the Czochralski (CZ) method, the $Lu_{1-x}Ce_xI_3$ single crystal was produced from the raw polycrystal material obtained in Example 2 (Step S140 of FIG. 1).

Figure 3:
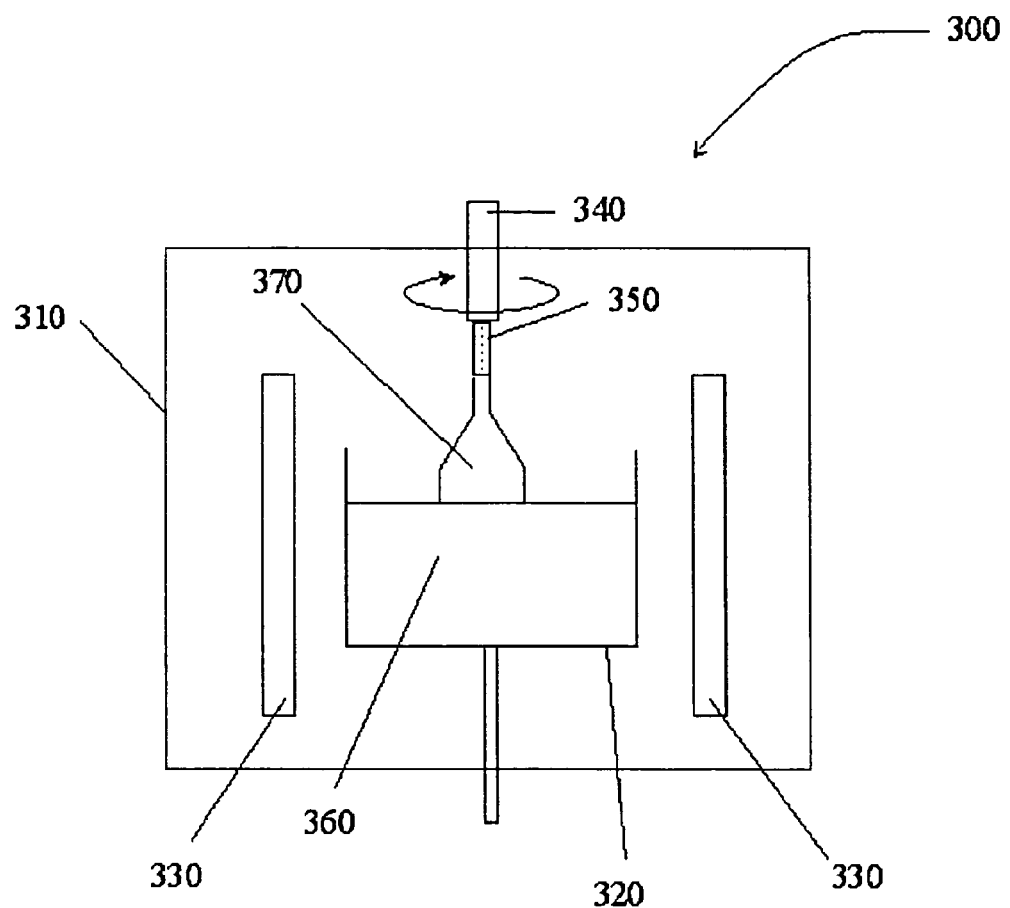
FIG. 3 is illustrative in schematic of how the inventive $Lu_{1-x}Ce_xI_3$ single crystal is produced by the inventive process using the Czochralski method.

FIG. 3 is illustrative in schematic of how the inventive $Lu_{1-x}Ce_xI_3$ single crystal was produced using the Czochralski method.

A single crystal-growth apparatus 300 is built up of a chamber 310, a crucible 320, a heater 330 and a pulling shaft 340.

The chamber 310 has an inlet (not shown) for feeding various atmosphere gases such that the interior atmosphere and/or pressure are controllable, and is connectable to a rotary pump and a turbo pump (not shown). The chamber 310 here was maintained inside at a degree of vacuum on the order of $10^{-4}$ Pa.

The crucible 320 is typically formed of quartz, and receives the raw polycrystal material produced in Example 2.

The heater 330 may operate in any desired heating mode such as high-frequency resistance heating mode, graphite resistance heating mode, and electric resistance heating mode in which the raw polycrystal material within the crucible 320 can be heated in a temperature range near 1,050° C. that is the melting point.

The pulling shaft 340 is typically a stainless rod having an elevator mechanism using an electric motor, and is capable of pulling up the grown single crystal depending on crystal growth. The pulling speed may be controlled either by the elevator mechanism using an electric motor or by a control unit (not shown). The pulling shaft 340 is provided at its end with a seed crystal 350 of $LuI_3$, and operates to rotate the seed crystal 350 at any desired speed. Such rotation, too, may be controlled by the control unit (not shown).

How to produce the $Lu_{1-x}Ce_xI_3$ single crystal using the CZ method is now explained with reference to FIG. 3.

A chamber 310 was evacuated inside to a vacuum by means of a rotary pump and a diffusion pump (not shown) to prevent oxidization of the raw polycrystal material and melt. Note here that the chamber 310 is filled inside with a gas selected from the group consisting of hydrogen gas, an inert atmosphere gas, and a mixed gas thereof.

The crucible 320 with the raw polycrystal material placed in it was heated by the heater 330, whereby the raw polycrystal material was molten within the crucible 320 into a melt 360. Then, the seed crystal 350 was brought into contact with the surface of the melt. The seed crystal 350 was rotated 10 times per minute, and pulled up at 3 mm/hour, causing growth of a $Lu_{1-x}Ce_xI_3$ single crystal 370. The ensuing single crystal was found to have a length and a diameter of 9 cm and 16 mm, respectively. Note here that ICP emission analysis was applied to the single crystal produced from the raw polycrystal material of Example 2 to examine its composition. Consequently, the ensuing single crystal was found to be $Lu_{0.95}Ce_{0.05}I_3$.

As a matter of course, the double-crucible CZ method, the continuous charge CZ method, etc. may also be applied here. Use may also be made of the EFG method in which a slit die (not shown) is located in the crucible 310.

EXAMPLE 2-3

Using the floating zone (FZ) method, the $Lu_{1-x}Ce_xI_3$ single crystal was produced from the raw polycrystal material obtained in Example 2 (Step S140 of FIG. 1).

Figure 4:
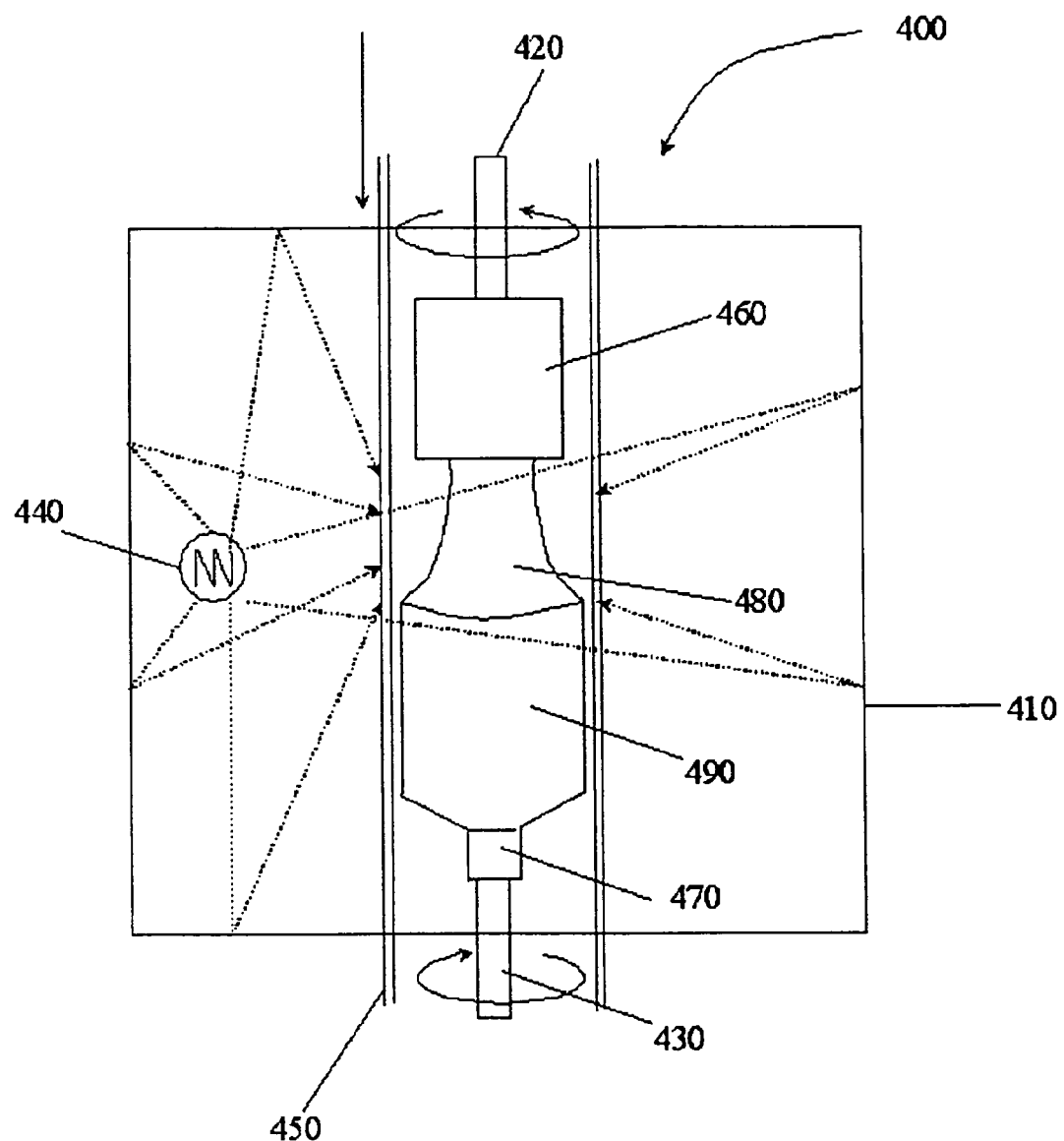
FIG. 4 is illustrative in schematic of how the inventive $Lu_{1-x}Ce_xI_3$ single crystal is produced by the inventive process using the floating zone method.

FIG. 4 is illustrative in schematic of how the inventive $Lu_{1-x}Ce_xI_3$ single crystal is produced using the floating zone method.

A single crystal-growth apparatus 400 is built up of a chamber 410, a first shaft 420, a second shaft 430, a lamp 440 and a reaction tube 450. A raw polycrystal material 460 obtained in Example 2 was attached to the first shaft 420 and a $LuI_3$ seed crystal 470 is attached to the second shaft 430, and these shafts are located within the reaction tube 450. The reaction tube 450 here could be made of quartz for the aforesaid reason. The first and second shafts 420 and 430 rotate in the opposite directions, and are capable of moving down as an integral piece.

The chamber 410 has an inlet (not shown) for feeding various atmosphere gases such that the interior atmosphere and/or pressure are controllable, and is connectable to a rotary pump and a turbo pump (not shown). The chamber 410 here was maintained inside at a degree of vacuum of $1 \times 10^{-5}$ Pa to $1 \times 10^{-6}$ Pa.

The lamp 440 is a halogen lamp or xenon lamp operating in the thermal imaging mode. In place of the lamp 440, use may also be made of any desired heating mode such as high-frequency heating mode, laser heating mode, metal resistance heating mode, electric resistance heating mode, and graphite resistance heating mode.

How to the $Lu_{1-x}Ce_xI_3$ single crystal using the FZ method is now explained with reference to FIG. 4.

The chamber 410 was evacuated inside to a vacuum by means of a rotary pump and a diffusion pump (not shown) to prevent oxidization of the raw polycrystal material and meld. Note here that the chamber 410 may be filled inside with a gas selected from the group consisting of hydrogen gas, an inert atmosphere gas and a mixed gas thereof.

The raw polycrystal material 460 attached to the first shaft 420 is heated and molten by the lamp 440 into a melt 480. The seed crystal 470 attached to the second shaft 430 was brought into contact with the melt 480. Then, the first and second shafts 420 and 430 were moved down at 3 mm/hour while they were rotated ten times per minute in the opposite directions.

This results in the growth of the $Lu_{1-x}Ce_xI_3$ single crystal 490. The obtained single crystal was found to have a length and a diameter of 10 cm and 10 mm, respectively. Note here that ICP emission analysis was applied to the single crystal produced from the raw polycrystal material of Example 2 to examine its composition. Consequently, the ensuing single crystal was found to be $Lu_{0.95}Ce_{0.05}I_3$.

Unlike Examples 2-1 and 2-2, Example 2-3 does not use the boat 220 and crucible 320: any entrainment of impurities is held back, allowing the ensuing single crystal to have higher purity. As a matter of course, this example could also be applied to the zone melt method.

Applicability To The Industry

The inventive iodide single crystal activated by the luminescence center RE where RE is at least one element selected from the group consisting of Ce, Pr, Nd, Sm, Eu, Tb, Dy, Ho, Er, Tm, and Yb is characterized in that a part of lutetium in the single crystal material is substituted by Y and/or Gd. Y that replaces lutetium contributes to an increased emission. On the other hand, Gd that replaces lutetium contributes to improvements in energy resolution. Such a single crystal would be best suited for the coming-generation TOF-PET, and promise to improve much on performance.

According to the inventive production process for $LuI_3$ single crystals activated by RE, it is possible to provide inexpensive yet high-purity iodide single crystals because high-purity yet less costly Lu metals, RE metals or $REI_3$ where RE is at least one element selected from the group consisting of Ce, Pr, Nd, Sm, Eu, Tb, Dy, Ho, Er, Tm, and Yb, and $I_2$ are used as the starting materials. When there is the $Lu_{1-x}RE_xI_3$ single crystal involved, emission wavelengths lie in the visible range so that in place of costly photomultiplier tube (PMT) adapted to sense wavelengths in the ultraviolet range, conventional, less costly PMTs adapted to sense wavelengths in the visible range can be applied to TOF-PET. It is thus possible to provide TOF-PET that is much less costlier and ever higher in quality than could be achieved so far.

The inventive iodide single crystal wherein a part in the Lu site in the $LuI_3$ single crystal activated by RE is substituted by Y and/or Gd as well as the single crystal obtained by the aforesaid production process may be applicable to any desired equipment making use of scintillation.

What we claim is:

1. A production process for an iodide single crystal having a crystal structure the same as $LuI_3$ and activated by a luminescence center RE, where RE is at least one element selected from the group consisting of Ce, Pr, Nd, Sm, Eu, Tb, Dy, Ho, Er, Tm, and Yb, the method comprising:
  a step of preparing starting materials comprising an RE metal or $REI_3$, $I_2$, and a Lu metal, and a metal of Y and/or Gd;
  a step of maintaining said starting materials under vacuum;
  a step of heating said starting materials at a reaction temperature of said starting materials to create a raw poly-crystal containing at least $LuXI_3$:RE, where X is Y and/or Gd; and
  a step of turning said raw poly-crystal into a single crystal.

2. A method for producing an iodide single crystal comprising a crystal structure the same as $LuI_3$ and activated by a luminescence center RE, where RE is at least one element selected from the group consisting of Ce, Pr, Nd, Sm, Eu, Tb, Dy, Ho, Er, Tm, and Yb, and a formula $Lu_{1-x}RE_xI_3$ ($1\times10^{-4}<x<0.2$), the method comprising:
  preparing a starting material comprising an RE metal or $REI_3$, $I_2$, and an Lu metal;
  maintaining the starting material under vacuum;
  heating the starting material at a reaction temperature of the starting material thereby producing a raw polycrystal including $LuI_3$:RE; and
  turning the raw polycrystal into a single crystal thereby obtaining an iodide single crystal.

3. A production process for an iodide single crystal as recited in claim 1, wherein,
  in said preparation step, said starting materials further include a metal of an M element, where M is at least one element selected from the group consisting of La, Sc, Hf, Zr, Ti, Ge, Ga, Al, Si, In, Nb, Ta, Ca, Mg, and Ba and/or an iodide of said M element, and
  in said step of heating said starting materials to create said raw polycrystal, said raw polycrystal further includes the iodide of said M element activated by said RE.

4. An iodide single crystal, comprising:
  a crystal structure the same as $(Y, Lu)I_3$ and activated by a luminescence center RE, where RE is at least one element selected from the group consisting of Ce, Pr, Nd, Sm, Eu, Tb, Dy, Ho, Er, Tm, and Yb,
  wherein an entire lutetium (Lu) in $(Y, Lu)I_3$ is substituted by at least one element selected from the group consisting of Sc, Hf, Zr, Ti, Ge, Al, Si, Nb, Ta, Ca, and Ba.

5. A scintillator, comprising:
  the iodide single crystal as recited in claim 4.

6. A production process for an iodide single crystal as recited in claim 2, wherein the RE in said RE metal or $REI_3$ is Ce or Pr.

* * * * *